United States Patent
Wang

(10) Patent No.: US 10,553,461 B2
(45) Date of Patent: Feb. 4, 2020

(54) FILM ANNEALING APPARATUS AND METHOD

(71) Applicant: BOE TECHNOLOGY GROUP CO., LTD., Beijing (CN)

(72) Inventor: Ming Wang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 101 days.

(21) Appl. No.: 15/961,753

(22) Filed: Apr. 24, 2018

(65) Prior Publication Data

US 2019/0013219 A1 Jan. 10, 2019

(30) Foreign Application Priority Data

Jul. 5, 2017 (CN) .......................... 2017 1 0543723

(51) Int. Cl.
*C30B 1/02* (2006.01)
*H01L 21/67* (2006.01)
*H01L 21/687* (2006.01)
*H01L 21/324* (2006.01)
*C30B 1/00* (2006.01)

(52) U.S. Cl.
CPC .......... *H01L 21/67103* (2013.01); *C30B 1/00* (2013.01); *C30B 1/02* (2013.01); *H01L 21/324* (2013.01); *H01L 21/687* (2013.01)

(58) Field of Classification Search
CPC .. C30B 1/00; C30B 1/02; C30B 35/00; H01L 21/324; H01L 21/687

See application file for complete search history.

(56) References Cited

U.S. PATENT DOCUMENTS 8,114,217 B2 * 2/2012 Jyumonji ........... B23K 26/0648
117/201
8,118,932 B2 * 2/2012 Buschbeck ............. H01L 22/12
117/201

(Continued)

FOREIGN PATENT DOCUMENTS

CN 101478005 * 6/2010

OTHER PUBLICATIONS

Miller et al "Morphology effects on spin-dependent transport and recombination in polyfluorene thin films" Physical Review B 94, 214202 (2016.*

*Primary Examiner* — Robert M Kunemund
(74) *Attorney, Agent, or Firm* — Kinney & Lange, P.A.

(57) ABSTRACT

The present disclosure provides a film annealing apparatus and method. The film annealing apparatus includes: a carrying platform configured to carry a substrate formed with a film layer thereon; a heater configured to individually heat respective regions of the film layer such that the film layer is annealed; a carrier detector configured to detect carrier concentrations of the respective regions of the film layer; and a controller electrically connected with the carrier detector and the heater respectively and configured to, according to the carrier concentrations of the respective regions of the film layer detected by the carrier detector, adjust at least one of a heating temperature and a heating time of the heater for heating a corresponding one of the regions of the film layer such that the carrier concentrations of the respective regions of the annealed film layer become the same.

20 Claims, 10 Drawing Sheets

(56) References Cited

U.S. PATENT DOCUMENTS

| | | | | |
|---|---|---|---|---|
| 8,734,583 B2* | 5/2014 | Forbes | ............... | H01L 27/105 |
| | | | | 117/4 |
| 8,895,416 B2* | 11/2014 | Sopori | ............ | H01L 21/02592 |
| | | | | 117/4 |
| 9,034,105 B2* | 5/2015 | Chaubey | ............ | C23C 16/4481 |
| | | | | 118/726 |
| 2011/0171382 A1* | 7/2011 | Gardiner | ............... | C07C 49/92 |
| | | | | 427/255.6 |
| 2015/0325659 A1* | 11/2015 | Hitora | ............... | H01L 21/0257 |
| | | | | 257/43 |

* cited by examiner

FILM ANNEALING APPARATUS AND METHOD

CROSS-REFERENCE TO RELATED APPLICATION

This application claims the priority benefit of the Chinese Patent Application No. 201710543723.X filed on Jul. 5, 2017 in the State Intellectual Property Office of China, the whole disclosure of which is incorporated herein by reference.

BACKGROUND

Technical Field

Embodiments of the present disclosure generally relate to the field of display technologies, and particularly to a film annealing apparatus and a method of annealing a film layer.

Description of the Related Art

The thin film transistor is an important electronic element that is widely applied in a display device. The display device generally comprises a plurality of thin film transistors formed on a substrate and each comprising an active layer. When forming the active layer, a semiconductor film layer is formed on the substrate generally by using a magnetron sputtering process and then is annealed, and then the annealed semiconductor film layer is patterned by using a patterning process including, for example, a photolithography process, so as to form the active layer.

A sputtering target used during forming the semiconductor film layer on the substrate generally by using the magnetron sputtering process, however, is generally a spliced sputtering target formed by splicing a plurality of semiconductor material targets together. When splicing the plurality of semiconductor material targets together, there is always a gap between two adjacent semiconductor material targets due to factors such as a splicing technique, an arrangement of magnets and the like. Thereby, in the final semiconductor film layer formed on the substrate, there is a difference between a region of semiconductor film layer corresponding to the semiconductor material target and other region of semiconductor film layer corresponding to the gap, and after subsequently annealing the semiconductor film layer, there is a difference between a carrier concentration of the region of semiconductor film layer corresponding to the semiconductor material target and a carrier concentration of other region of semiconductor film layer corresponding to the gap. This will result in that, for a plurality of thin film transistors subsequently formed on the substrate, distributions of the carrier concentrations of the active layers of thin film transistor are not uniform, thereby causing a reduced display quality of an image displayed by the display device, for example, causing occurrence of a mura phenomenon.

SUMMARY

In an aspect, an embodiment of the present disclosure provides a film annealing apparatus, comprising:
a carrying platform configured to carry a substrate formed with a film layer thereon;
a heater configured to individually heat respective regions of the film layer such that the film layer is annealed;
a carrier detector configured to detect carrier concentrations of the respective regions of the film layer; and
a controller electrically connected with the carrier detector and the heater respectively and configured to, according to the carrier concentrations of the respective regions of the film layer detected by the carrier detector, adjust at least one of a heating temperature and a heating time of the heater for heating a corresponding one of the regions of the film layer such that the carrier concentrations of the respective regions of the annealed film layer become the same.

In some embodiments, the film annealing apparatus comprises a plurality of the carrier detectors located above the carrying platform and each configured to detect the carrier concentration of corresponding one or more of the regions of the film layer.

In some embodiments, the film annealing apparatus comprises a plurality of the carrier detectors arranged into one row in an arrangement direction, the one row of the carrier detectors being located above the carrying platform and movable horizontally in a direction perpendicular to the arrangement direction so as to scan the respective regions of the film layer, such that each of the carrier detectors detects the carrier concentration of one or more of the regions of the film layer scanned by the each carrier detector.

In some embodiments, the number of the carrier detector is one, the carrier detector is located above the carrying platform, and the carrier detector is movable horizontally at least in two directions perpendicular to each other so as to scan the respective regions of the film layer and detect the carrier concentrations of the respective regions of the film layer.

In some embodiments, the carrier detector is configured to detect the carrier concentrations of the respective regions of the film layer in a Microwave Photo Conductivity Decay way.

In some embodiments, the controller comprises a first receiver, a first determination device and a first adjustment device, the first receiver is in electrical communication with the carrier detector and configured to receive the carrier concentrations of the respective regions of the film layer detected by the carrier detector; the first determination device is electrically connected with the first receiver and configured to compare the carrier concentrations of the respective regions of the film layer with a concentration threshold; and the first adjustment device is electrically connected with the first determination device and the heater respectively, and configured to, according to the comparison result, adjust at least one of the heating temperature and the heating time of the heater for heating a corresponding one of the regions of the film layer such that the carrier concentrations of the respective regions of the annealed film layer become the same as the concentration threshold.

In some embodiments, the first adjustment device is configured to: in response to the carrier concentration of a certain one of the regions of the film layer being smaller than the concentration threshold, increase at least one of the heating temperature and the heating time of the heater for heating the certain one of the regions of the film layer such that the carrier concentration of the certain one of the regions of the annealed film layer becomes the same as the concentration threshold; and in response to the carrier concentration of another certain one of the regions of the film layer being larger than the concentration threshold, reduce the heating temperature and/or the heating time of the heater for heating the another certain one of the regions of the film layer such that the carrier concentration of the another certain one of the regions of the annealed film layer becomes the same as the concentration threshold.

In some embodiments, the controller comprises a second receiver, a first calculation device, a second determination device and a second adjustment device, the second receiver is in electrical communication with the carrier detector and configured to receive the carrier concentrations of the respective regions of the film layer detected by the carrier detector; the first calculation device is electrically connected with the second receiver and configured to calculate an average value of the carrier concentrations of the respective regions of the film layer detected before the adjustment or after being previously adjusted; the second determination device is electrically connected with the second receiver and the first calculation device respectively and configured to compare the carrier concentration of a being-currently-adjusted one of the regions of the film layer with the average value; and the second adjustment device is electrically connected with the second determination device and the heater respectively and configured to, according to the comparison result, adjust at least one of the heating temperature and the heating time of the heater for heating the being-currently-adjusted of the regions of the film layer such that the carrier concentrations of the respective regions of the annealed film layer become the same as the average value.

In some embodiments, the second adjustment device is configured to: in response to the carrier concentration of the being-currently-adjusted one of the regions of the film layer being smaller than the average value, increase at least one of the heating temperature and the heating time of the heater for heating the being-currently-adjusted one of the regions of the film layer such that the carrier concentration of the adjusted one of the regions of the annealed film layer becomes the same as the average value; and in response to the carrier concentration of the being-currently-adjusted one of the regions of the film layer being larger than the average value, reduce at least one of the heating temperature and the heating time of the heater for heating the being-currently-adjusted one of the regions of the film layer such that the carrier concentration of the adjusted one of the regions of the annealed film layer becomes the same as the average value.

In some embodiments, the film annealing apparatus comprises a plurality of the heaters, the plurality of the heaters being arranged in an array and corresponding to the respective regions of the film layer such that each of the plurality of the heaters is controlled by the controller to heat one or more of the regions of the film layer.

In some embodiments, the film annealing apparatus comprises a plurality of the heaters arranged into one row in an arrangement direction, each of the plurality of the heaters being movable relative to the film layer in a direction perpendicular to the arrangement direction so as to heat one or more of the regions of the film layer.

In some embodiments, the number of the heater is one, and the heater is movable relative to the film layer at least in two directions perpendicular to each other so as to heat one or more of the regions of the film layer.

In some embodiments, the heater is located below the carrying platform, or the heater is located within the carrying platform.

In some embodiments, the heater includes a heating block or a heating wire.

In another aspect, an embodiment of the present disclosure provides a method of annealing a film layer, comprising:

placing a substrate formed with the film layer thereon on a carrying platform;

heating the film layer by a heater such that the film layer is annealed;

detecting carrier concentrations of the respective regions of the film layer by using a carrier detector;

adjusting, by a controller, according to the carrier concentrations of the respective regions of the film layer detected by the carrier detector, at least one of a heating temperature and a heating time for heating a corresponding one of the regions of the film layer such that the carrier concentrations of the respective regions of the annealed film layer become the same.

In some embodiments, adjusting, by a controller, according to the carrier concentrations of the respective regions of the film layer detected by the carrier detector, at least one of a heating temperature and a heating time for heating a corresponding one of the regions of the film layer such that the carrier concentrations of the respective regions of the annealed film layer become the same comprises:

receiving, by a first receiver of the controller, the carrier concentrations of the respective regions of the film layer detected by the carrier detector;

comparing, by a first determination device of the controller, the carrier concentrations of the respective regions of the film layer with a concentration threshold;

increasing, in response to the carrier concentration of a certain one of the regions of the film layer being smaller than the concentration threshold and by a first adjustment device of the controller, at least one of the heating temperature and the heating time of the heater for heating the certain one of the regions of the film layer such that the carrier concentration of the certain one of the regions of the annealed film layer becomes the same as the concentration threshold;

reducing, in response to the carrier concentration of another certain one of the regions of the film layer being larger than the concentration threshold and by the first adjustment device of the controller, at least one of the heating temperature and the heating time of the heater for heating the another certain one of the regions of the film layer such that the carrier concentration of the another certain one of the regions of the annealed film layer becomes the same as the concentration threshold.

In some embodiments, adjusting, by a controller and according to the carrier concentrations of the respective regions of the film layer detected by the carrier detector, at least one of a heating temperature and a heating time for heating a corresponding one of the regions of the film layer such that the carrier concentrations of the respective regions of the annealed film layer become the same comprises:

receiving, by a second receiver of the controller, the carrier concentrations of the respective regions of the film layer detected by the carrier detector;

calculating, by a first calculation device of the controller, an average value of the carrier concentrations of the respective regions of the film layer detected before the adjustment or after being previously adjusted;

comparing, by a second determination device of the controller, the carrier concentration of a being-currently-adjusted one of the regions of the film layer with the average value;

increasing, in response to the carrier concentration of the being-currently-adjusted one of the regions of the film layer being smaller than the average value and by a second adjustment device of the controller, at least one of the heating temperature and the heating time of the heater for heating the being-currently-adjusted one of the regions of the film layer such that the carrier concentration of the adjusted one of the regions of the annealed film layer becomes the same as the average value; and reducing, in response to the carrier concentration of the being-currently-adjusted one of the regions of the film layer being larger than the average value and by the second adjustment device of the controller, at least one of the heating temperature and the heating time of the heater for heating the being-currently-adjusted one of the regions of the film layer such that the carrier concentration of the adjusted one of the regions of the annealed film layer becomes the same as the average value.

In some embodiments, detecting carrier concentrations of the respective regions of the film layer by using a carrier detector comprises: detecting, by each of a plurality of the carrier detectors, the carrier concentration of corresponding one or more of the regions of the film layer.

In some embodiments, detecting carrier concentrations of the respective regions of the film layer by using a carrier detector comprises: moving horizontally a plurality of the carrier detectors, which are arranged into one row in an arrangement direction, in a direction perpendicular to the arrangement direction such that each of the carrier detectors scans and detects the carrier concentration of one or more of the regions of the film layer.

In some embodiments, detecting carrier concentrations of the respective regions of the film layer by using a carrier detector comprises: driving the carrier detector to move horizontally relative to the film layer alternately in two directions perpendicular to each other so as to scan the respective regions of the film layer and detect the carrier concentrations of the respective regions of the film layer.

BRIEF DESCRIPTION OF THE DRAWINGS

The drawings are provided herein for further understanding of technique schemes of the present disclosure, and constitute a part of the present disclosure. Exemplary embodiments of the present disclosure and description thereof are intended to illustrate the technique schemes of the present disclosure, rather than being limitative to the technique schemes of the present disclosure. In the drawings.

DETAILED DESCRIPTION OF EXEMPLARY EMBODIMENTS

In order to more clearly provide the objectives, technical solutions and advantages of the embodiments of the present disclosure, the technical solutions in the embodiments of the present disclosure will be clearly and completely described below, with reference to the accompanying drawings in the embodiments of the present disclosure. It will be apparent that the described embodiments only represent a part of the present disclosure, rather than all the embodiments of the present disclosure. All other embodiments obtained by those skilled in the art based on the embodiments of the present disclosure without creative efforts fall within the scope of the present disclosure.

In addition, in the description as below, much specific detail is described to provide comprehensive understanding of the embodiments of the present disclosure for ease of presentation. However, it is obvious one or more embodiments may be implemented without the detail. In other situation, known structure and device are shown by means of diagrammatic presentation to simplify the accomplish drawings.

Figure 1:
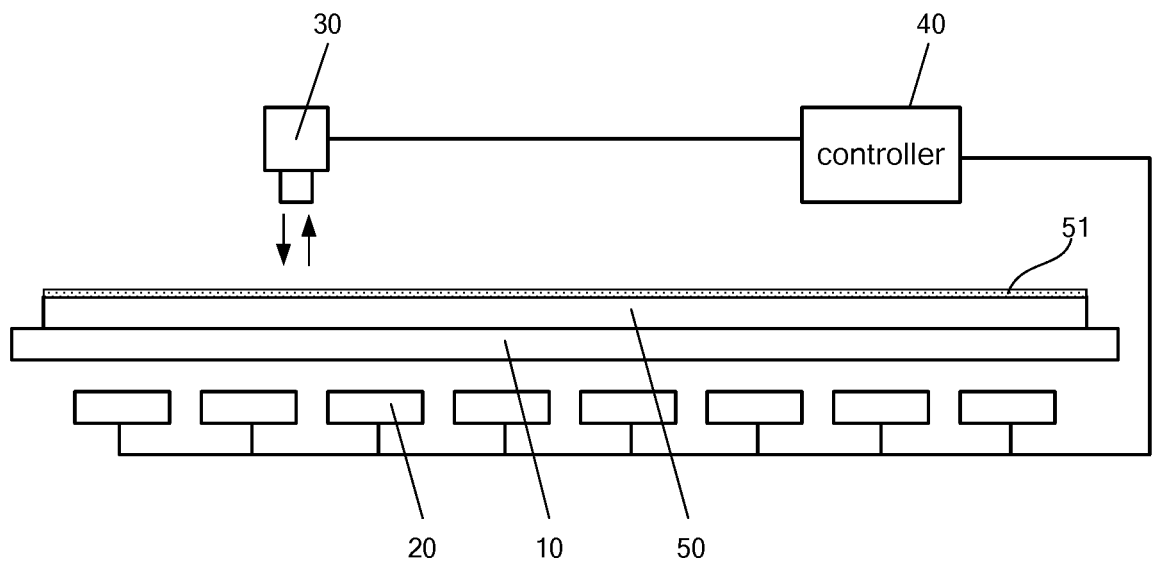
FIG. 1 is a structural schematic diagram of a film annealing apparatus according to an embodiment of the present disclosure.

Referring to FIG. 1, an embodiment of the present disclosure provides a film annealing apparatus, comprising: a carrying platform 10 configured to carry a substrate 50 formed with a semiconductor film layer 51 thereon; a heater 20 configured to heat respective regions of the film layer such that the film layer is annealed; for example, the heater may individually heat respective regions of the film layer; a carrier detector 30 configured to detect carrier concentrations of the respective regions of the semiconductor film layer 51; and a controller 40, the controller 40 being electrically connected with the carrier detector 30 and the heater 20 respectively, and configured to, according to the carrier concentrations of the respective regions of the film layer detected by the carrier detector, adjust at least one of a heating temperature and a heating time of the heater 20 for heating a corresponding one of the regions of the film layer such that the carrier concentrations of the respective regions of the annealed film layer become the same.

The film annealing apparatus provided according to embodiments of the present disclosure may be used for annealing the semiconductor film layer formed on the substrate, such that there are identical or uniform effective or activated carrier concentrations in respective regions or at respective positions of the annealed semiconductor film layer, then the annealed semiconductor film layer is subject to subsequent processes including, for example, a patterning process, so as to form an active layer of a semiconductor device such as a thin film transistor. In some examples, the semiconductor film layer may be formed on the substrate through a magnetron sputtering process, for example, the semiconductor film layer covers a whole upper surface of the substrate; a sputtering target used in the magnetron sputtering process may be a spliced sputtering target formed by splicing a plurality of semiconductor material targets together, and the semiconductor film layer may be a metal oxide film layer, for example, an Indium Gallium Zinc Oxide (IGZO) layer, a Zinc Oxide (ZnO) layer or the like.

Referring to FIG. 1, the film annealing apparatus provided according to embodiments of the present disclosure embodiment comprises a carrying platform 10, a heater 20, a carrier detector 30 and a controller 40, the carrying platform 10 may have a plate or disk shape and is configured for carrying a substrate 50 formed thereon with a semiconductor film layer 51; when the substrate 50 formed thereon with the semiconductor film layer 51 is placed on the carrying platform 10, the semiconductor film layer 51 is located on a side of the substrate 50 facing away from the carrying platform 10. In the embodiment shown in FIG. 1, there are a plurality of heaters 20, each heater 20 corresponds to one or more regions of the semiconductor film layer 51 and may heat the corresponding region(s) of the semiconductor film layer; that is, a heating range of each heater 20 corresponds to one or more regions of the semiconductor film layer, and heating ranges of all heaters 20 cover the whole semiconductor film layer. In an example, a plurality of heater 20 may be arranged such that surfaces or heating surface of them facing towards the substrate 50 are in located a same plane or aligned with each other or positioned at a substantially same distance from the substrate or the semiconductor film layer on the substrate. The carrier detector 30 may be located above the carrying platform 10, for example, faces the semiconductor film layer 51 on substrate, and the carrier detector 30 is used for detecting carrier concentrations of respective regions of the semiconductor film layer; the controller 40 is electrically connected with the carrier detector 30 and the heater 20 respectively, and configured to receive the carrier concentrations of the respective regions of the semiconductor film layer detected by the carrier detector 30, and to adjust, according to the carrier concentrations of the respective regions of the semiconductor film layer detected by the carrier detector 30, at least one of a heating temperature and a heating time of the heater 20 for heating a corresponding one of the regions of the semiconductor film layer such that the carrier concentrations of the respective regions of the annealed semiconductor film layer are the same or identical. In some examples, the carrier detector detects in real time the carrier concentrations of the respective regions of the semiconductor film layer; in other examples, the carrier detector intermittently detects the carrier concentrations of the respective regions of the semiconductor film layer at a certain time interval.

During annealing a semiconductor film layer formed on a substrate by using the film annealing apparatus provided according to embodiments of the present disclosure, firstly the substrate formed thereon with the semiconductor film layer may be placed on the carrying platform such that the semiconductor film layer is located on a side of the substrate facing away from the carrying platform; then, the semiconductor film layer is heated by all heaters simultaneously, for example, is pre-heated for a certain time period, such that doped ions or carriers in the semiconductor film layer are partially activated; then, carrier concentrations of the respective regions of the semiconductor film layer are detected by the carrier detector; and heating temperatures and/or heating time of the heaters for subsequently heating corresponding regions of the semiconductor film layer are adjusted by the controller according to the carrier concentrations of the respective regions of the semiconductor film layer detected by the carrier detector; for example, if the carrier concentration of a certain region of the semiconductor film layer is lower, the heating temperature and/or the heating time of the heater (for example, the heater corresponding to the region of the semiconductor film layer) for subsequently heating the region is increased so as to increase an annealing temperature and/or an annealing time for the region of the semiconductor film layer, thereby increasing the carrier concentration in the region of the semiconductor film layer; if the carrier concentration of a certain other region of semiconductor film layer is higher, the heating temperature and/or the heating time of the heater (for example, the heater corresponding to the other region of the semiconductor film layer) for subsequently heating the other region is reduced so as to decrease an annealing temperature and/or an annealing time for the other region of the semiconductor film layer, thereby increasing the carrier concentration in the other region of the semiconductor film layer. As such, the carrier concentrations of the respective regions of the semiconductor film layer become the same or identical, or the carrier concentrations of the respective regions of the semiconductor film layer are made to be at a same level.

It is noted that in embodiments of the present disclosure, for the expression "to adjust a heating temperature and/or a heating time of the heater for heating a corresponding one of the regions of the film layer such that the carrier concentrations of the respective regions of the annealed film layer are or become the same", the phrase "the same" may be understood herein as "being completely the same or identical", that is, the carrier concentrations of the respective regions of the annealed film layer are equal to one another, or the phrase "the same" may be understood as "being substantially the same or identical", that is, a fluctuation is allowable in the carrier concentrations of respective regions of the annealed film layer and fluctuation values of the carrier concentrations of respective regions of the annealed film layer are within a certain range, which may be set as desired, that is, the carrier concentrations of respective regions of the annealed film layer are within a threshold range. It is also noted that in the present disclosure, increasing or reducing a heating or annealing temperature means increasing or reducing the temperature in a temperature range suitable for activating doped ions or carriers in the film layer.

As can be seen from above, in the film annealing apparatus provided according to embodiments of the present disclosure, the carrier concentrations of respective regions of the semiconductor film layer on the substrate placed on the carrying platform are detected by using the carrier detector, and the controller is used to adjust, according to the carrier concentrations of the respective regions of the semiconductor film layer detected by the carrier detector, at least one of a heating temperature and a heating time of the heater for heating a corresponding one of the regions of the semiconductor film layer so as to adjust annealing temperatures and/or annealing time for the respective regions of the semiconductor film layer, and thereby adjust the carrier concentrations of the respective regions of the semiconductor film layer such that the carrier concentrations of the respective regions of the annealed semiconductor film layer are the same or identical. Thus, after subsequently processing the semiconductor film layer, the carrier concentration of the active layer formed on the substrate has a uniform distribution, thereby improving the display quality of an image displayed by the display device, for example, preventing occurrence of a mura phenomenon.

Further, in the film annealing apparatus provided according to embodiments of the present disclosure, the carrier concentrations of the respective regions of the semiconductor film layer are detected by the carrier detector such that the carrier concentrations of the respective regions of the semiconductor film layer may be monitored, and the heating temperature and/or heating time of the heater for heating a corresponding region of the semiconductor film layer may be adjusted by the controller according to the carrier concentrations of the respective regions of the semiconductor film layer detected by the carrier detector, so that the carrier concentrations of the respective regions of the semiconductor film layer may be adjusted to an desired value, thereby improving the performance of a semiconductor (e.g., a thin film transistor) formed on the substrate.

Although it is described in the above embodiments that the film annealing apparatus is provided for annealing the semiconductor film layer formed on the substrate, in practice the film annealing apparatus provided according to the above film annealing apparatus may also be used for annealing other film layer which is intended to be annealed, and in this case, the carrier detector may be used to detect carrier concentrations in respective regions of this film layer, or an another detection device may be used to detect other parameter(s) (for example, parameter(s) associated with a heating/annealing temperature or a heating time) of this film layer.

In embodiments of the present disclosure, the number and arrangement of the carrier detector may be set as required in practice. In the following, three exemplary arrangements of the carrier detector are described as examples, and the arrangement of the carrier detector includes but is not limited to the exemplary ones. It is noted that in a case where a semiconductor film layer generally covers a whole upper surface or major surface of the substrate, a positional relationship of the carrier detector relative to the substrate may be referred to as a positional relationship between the carrier detector and the semiconductor film layer.

Figure 2:
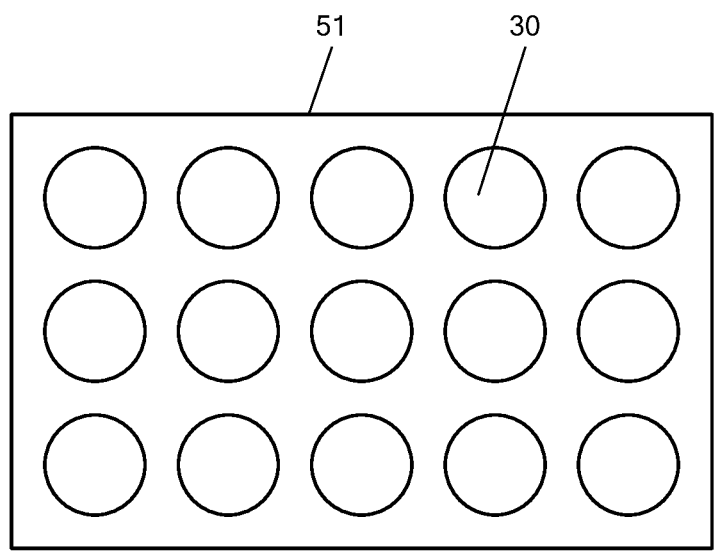
FIG. 2 is a plan view showing an arrangement of carrier detectors, relative to a film layer, of a film annealing apparatus according to an embodiment of the present disclosure.

In one embodiment, referring to FIG. 2, there are a plurality of carrier detectors 30, the plurality of carrier detectors 30 are located above the carrying platform 10, each carrier detector 30 has a detection range corresponding to one or more of regions of the semiconductor film layer 51, detection ranges of all the carrier detectors 30 cover the whole of the semiconductor film layer, and each carrier detector 30 is used to detect a carrier concentration of the corresponding region of the semiconductor film layer. Exemplarily, each carrier detector 30 is fixed in position relative to the semiconductor film layer 51. When it is desired to detect carrier concentrations of respective regions of the semiconductor film layer by using the carrier detectors 30, all of the carrier detectors 30 are started up such that each carrier detector 30 detects the carrier concentration of the corresponding region of the semiconductor film layer.

Figure 3:
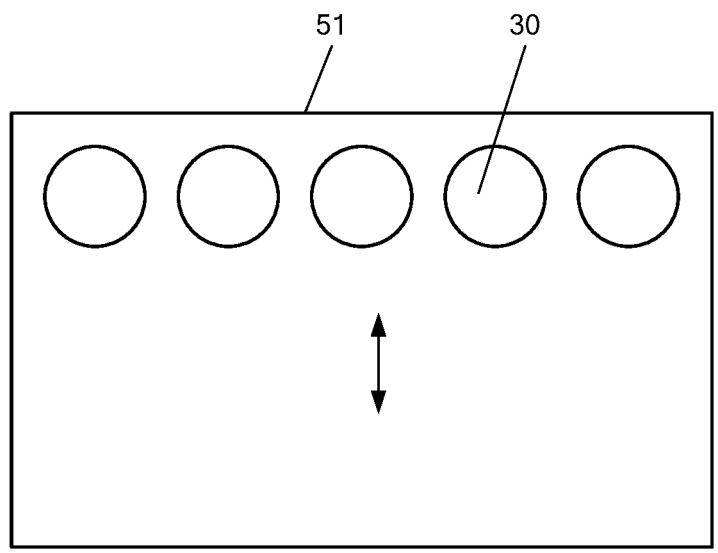
FIG. 3 is a plan view showing an arrangement of carrier detectors, relative to a film layer, of a film annealing apparatus according to another embodiment of the present disclosure.

In another embodiment, referring to FIG. 3, there are a plurality of carrier detectors 30, the plurality of carrier detectors 30 are arranged in one row, and the row of the carrier detectors 30 are located above the carrying platform 10. In an example, if a whole or a part of the substrate or the semiconductor film layer on the substrate has a substantially rectangular or polygonal section shape, an arrangement direction of the carrier detectors 30 is parallel to one of side edges of the substrate or of the semiconductor film layer on the substrate; in other examples, if the substrate or the semiconductor film layer on the substrate has a circular section shape, an arrangement length of the row of carrier detectors is equal to or larger than a diameter of the circular section shape. The row of carrier detectors 30 is movable horizontally in a direction perpendicular to the arrangement direction; when the row of carrier detectors 30 is moved horizontally in the direction perpendicular to the arrangement direction, each carrier detector 30 detects the carrier concentration of the region of the semiconductor film layer scanned by the carrier detector 30. For example, continuing to refer to FIG. 3, the number of the carrier detectors 30 is five, and the five carrier detectors 30 are arranged into one row in a left and right direction in FIG. 3, that is, the arrangement direction of the carrier detectors 30 in the row is the left and right direction in FIG. 3, this arrangement direction is parallel to an upper side edge or a lower side edge of the rectangular semiconductor film layer 51 in FIG. 3, and the row of carrier detectors 30 may be movable horizontally in a direction perpendicular to the left and right direction in FIG. 3, that is, the row of carrier detectors 30 may be movable horizontally in an up and down direction. When it is desired to detect carrier concentrations of respective regions of the semiconductor film layer by using the carrier detectors 30, all of the carrier detectors 30 are started up and moved in the up and down direction in FIG. 3, such that each carrier detector 30 can scan the semiconductor film layer on the substrate 50 so as to detect the carrier concentration of the corresponding region of the semiconductor film layer scanned by the carrier detector.

Figure 4:
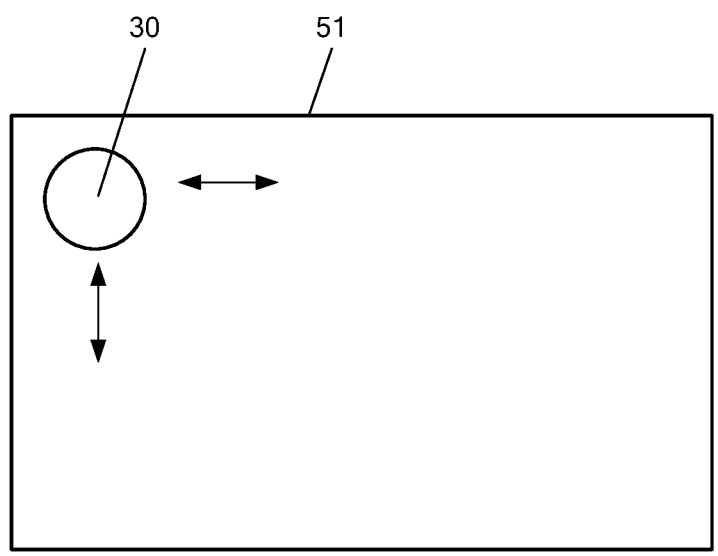
FIG. 4 is a plan view showing an arrangement of carrier detectors, relative to a film layer, of a film annealing apparatus according to a further embodiment of the present disclosure.

In other embodiment, referring to FIG. 4, the number of the carrier detector 30 is one, and the carrier detector 30 is located above the carrying platform 10. The carrier detector 30 may be movable horizontally in two directions perpendicular to each other, for example, movable horizontally in a direction parallel to a first side edge of the rectangular semiconductor film layer 51 and a direction parallel to a second side edge of the rectangular semiconductor film layer 51, and the first side edge and the second side edge of the rectangular semiconductor film layer 51 are perpendicular to each other; when the carrier detector 30 is moved horizontally and alternately in the two directions perpendicular to each other, the carrier detector detects carrier concentration of respective regions of the semiconductor film layer. Specifically, continuing referring to the plan view of FIG. 4, the number of the carrier detector 30 is one, the rectangular semiconductor film layer 51 comprises an upper side edge, a lower side edge, a left side edge and a right side edge in FIG. 4, the upper side edge is parallel to the lower side edge, the left side edge is parallel to the right side edge, and the upper side edge is perpendicular to the left side edge. Assuming that the upper side edge of the semiconductor film layer 51 in FIG. 4 is the first side edge of the semiconductor film layer 51, and the left side edge of the semiconductor film layer 51 in FIG. 4 is the second side edge of the semiconductor film layer 51, the carrier detector 30 may be moved horizontally in a direction parallel to the upper side edge of the semiconductor film layer 51 in FIG. 4 and a direction parallel to the left side edge of the semiconductor film layer 51 in FIG. 4, that is, the carrier detector 30 is movable horizontally in a left and right direction and an up and down direction in FIG. 4. If the substrate or the semiconductor film layer on the substrate has a circular section shape, the carrier detector is movable in a radial direction of the circular section shape or in a direction parallel to the radial direction. When it is desired to detect carrier concentrations of respective regions of the semiconductor film layer by using the carrier detector 30, the carrier detector 30 is started up and is driven to move horizontally and alternately in the left and right direction and the up and down direction in FIG. 4, so that carrier concentrations of respective regions of the semiconductor film layer are detected by the carrier detector.

In an example, when the carrier detector 30 is driven to move horizontally and alternately in the left and right direction and the up and down direction in FIG. 4, it is assumed that, for example, an initial park position of the carrier detector 30 corresponds to an upper and left corner of the semiconductor film layer 51 in FIG. 4, then the carrier detector 30 is firstly moved rightwards in the left and right direction in FIG. 4 so as to perform a first horizontal movement, such that the carrier detector 30 makes a first scan on the semiconductor film layer in the left and right direction in FIG. 4 and detects the carrier concentration of the region of the semiconductor film layer scanned during the first scan; after the carrier detector 30 makes the first horizontal movement from the left side towards the right side in FIG. 4 to reach the right side in FIG. 4, the carrier detector 30 is driven to make a second horizontal movement downwards in the up and down direction in FIG. 4, such that a detection range of the carrier detector 30 obtained after making the second horizontal movement in the up and down direction in FIG. 4 closely abuts a detection range of the carrier detector 30 obtained before making the second horizontal movement in the up and down direction in FIG. 4; then, the carrier detector 30 is driven to make a third horizontal movement leftwards in the left and right direction in FIG. 4, such that the carrier detector 30 makes a second scan on the semiconductor film layer in the left and right direction in FIG. 4 and detects the carrier concentration of the region of the semiconductor film layer scanned during the second scan; after the carrier detector 30 makes the third horizontal movement from the right side towards the left side in FIG. 4 to reach the left side in FIG. 4, the carrier detector 30 is driven to make a fourth horizontal movement downwards in the up and down direction in FIG. 4, such that a detection range of the carrier detector 30 obtained after making the fourth horizontal movement in the up and down direction in FIG. 4 closely abuts a detection range of the carrier detector 30 obtained before making the fourth horizontal movement in the up and down direction in FIG. 4; as such, the carrier detector 30 is driven to move horizontally and alternately in the left and right direction and the up and down direction in FIG. 4, enabling detection of the carrier concentrations of the respective regions of the semiconductor film layer.

It is noted in the above embodiments, the carrier detector 30 scans the semiconductor film layer so as to detect the carrier concentrations of the respective regions of the semiconductor film layer when moving horizontally in the left and right direction in FIG. 4; in practice, the carrier detector 30 may also scan the semiconductor film layer so as to detect the carrier concentrations of the respective regions of the semiconductor film layer when moving horizontally in the up and down direction in FIG. 4, and in this case, the sequence of horizontally moving the carrier detector 30 alternately in the left and right direction in FIG. 4 and in the up and down direction in FIG. 4 is opposite to that described above but will be made in a same way as that described above, and thus will not be repeatedly described.

Figure 5:
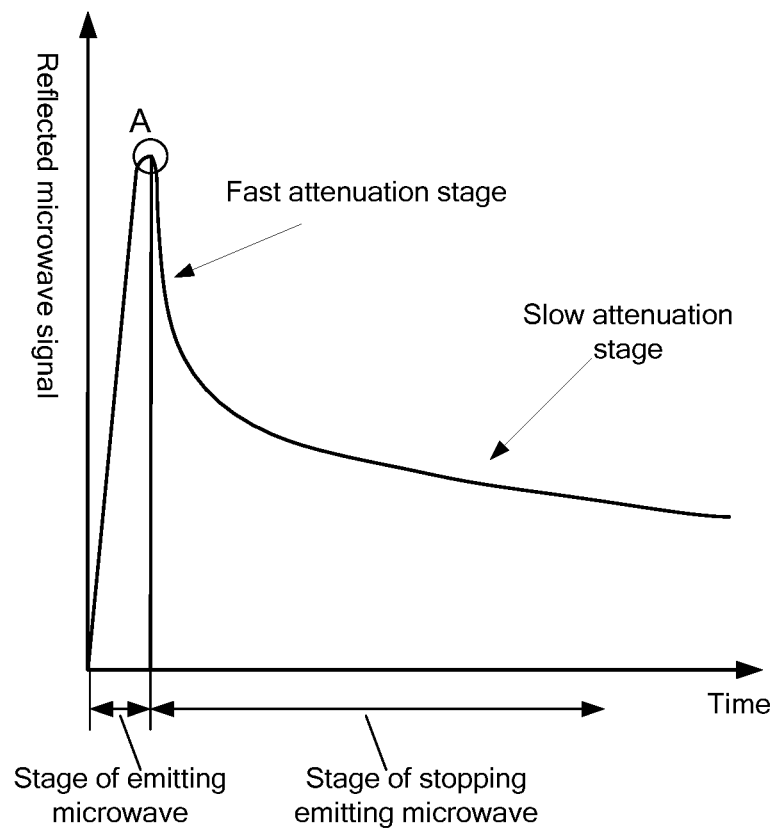
FIG. 5 is a graph showing a carrier attenuation curve plotted by a carrier detector according to an embodiment of the present disclosure.

In the above embodiments, the carrier detector 30 may be configured to detect the carrier concentrations of the respective regions of the film layer in a Microwave Photo Conductivity Decay way (μ-PCD) in which the carrier detector 30 emits a microwave to a certain region of the semiconductor film layer and receives a reflected microwave from the region of the semiconductor film layer, and the carrier detector 30 plots, according to received reflected microwave from the region of the semiconductor film layer, a carrier attenuation curve of the region, as shown in FIG. 5, where a peak value of the carrier attenuation curve (a value at a point A in FIG. 5) may be used as the carrier concentration of the region.

Figure 6:
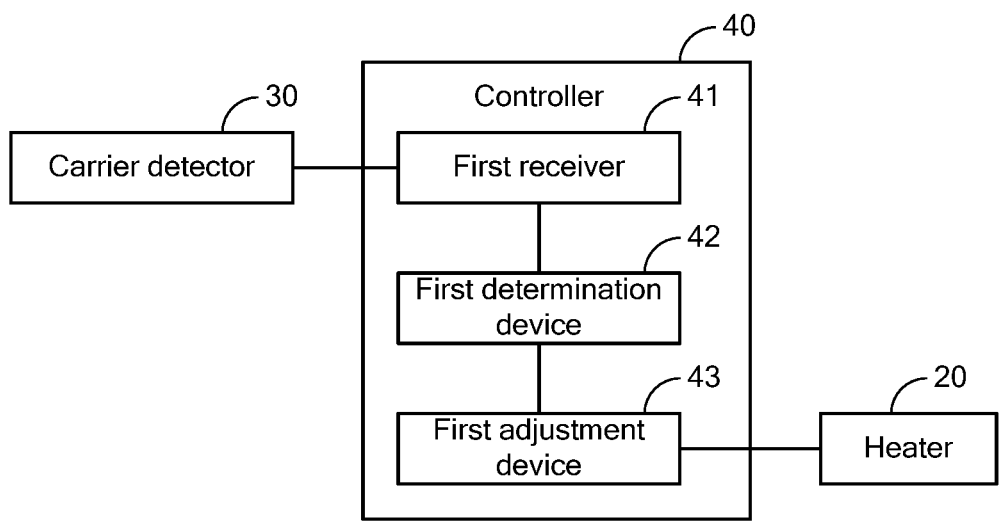
FIG. 6 is a block diagram showing an arrangement of a carrier detector, a controller and a heater of a film annealing apparatus according to an embodiment of the present disclosure.

In the film annealing apparatus provided according to embodiments of the present disclosure, the controller 40 is configured to, according to the carrier concentrations of the respective regions of the semiconductor film layer detected by the carrier detector 30, adjust at least one of a heating temperature and a heating time of the heater 20 for heating a corresponding one of the regions of the film layer. In one embodiment, referring to FIG. 6, the controller 40 comprise a first receiver 41, a first determination device 42 and a first adjustment device 43; the first receiver 41 is electrically connected with or in electrical communication with the carrier detector 30 and configured to receive the carrier concentrations of the respective regions of the semiconductor film layer detected by the carrier detector 30; the first determination device 42 is electrically connected with the first receiver 41 and configured to compare the carrier concentrations of the respective regions of the semiconductor film layer with a concentration threshold; the first adjustment device 43 is electrically connected with the first determination device 42 and each of the heaters 20 respectively, and configured to, if the carrier concentration of a certain region of the semiconductor film layer is smaller than the concentration threshold, increase the heating temperature and/or the heating time of the heater (for example, the heater corresponding to the region of the semiconductor film layer having the carrier concentration smaller than the concentration threshold) for subsequently heating the region such that the carrier concentration of the region is equal to the concentration threshold; the first adjustment device 43 is further configured to, if the carrier concentration of a certain other region of semiconductor film layer is larger than the concentration threshold, reduce the heating temperature and/or the heating time of the heater (for example, the heater corresponding to the other region of the semiconductor film layer having the carrier concentration larger than the concentration threshold) for subsequently heating the other region such that the carrier concentration of the region is equal to the concentration threshold.

When the controller 40 adjusts, according to the carrier concentrations of the respective regions of the film layer detected by the carrier detector 30, at least one of a heating temperature and a heating time of each heater 20 for heating a corresponding one of the regions of the film layer, the first receiver 41 receives carrier concentrations of respective regions of the semiconductor film layer detected by the carrier detector 30; when, the first determination device 42 compares the carrier concentrations of the respective regions of the semiconductor film layer detected by the carrier detector 30 with a concentration threshold, which may be set as desired in practice; when the first determination device 42 determines the carrier concentration of a certain region of the semiconductor film layer is smaller than the concentration threshold, the first adjustment device 43 increases the heating temperature and/or the heating time of the heater 20 (for example, the heater corresponding to the region of the semiconductor film layer having the carrier concentration smaller than the concentration threshold) for subsequently heating the region so as to increase an annealing temperature and/or an annealing time for annealing the region of the semiconductor film layer having the carrier concentration smaller than the concentration threshold and thereby increase the carrier concentration of the region, such that the carrier concentration of the region becomes completely or substantially the same as or equal to the concentration threshold. When the first determination device 42 determines the carrier concentration of a certain other region of the semiconductor film layer is larger than the concentration threshold, the first adjustment device 43 reduces the heating temperature and/or the heating time of the heater 20 (for example, the heater corresponding to the region of the semiconductor film layer having the carrier concentration larger than the concentration threshold) for subsequently heating the region; for example, the first adjustment device 43 causes the heater 20, which corresponds to the region of the semiconductor film layer having the carrier concentration larger than the concentration threshold, to stop heating the region; in some examples, when the heater 20 is a heater for heating by using a current, the first adjustment device 43 controls the amplitude and/or turning-on time of the current inputted to the heater 20, which corresponds to the region of the semiconductor film layer having the carrier concentration larger than the concentration threshold, to be reduced so as to decrease an annealing temperature and/or an annealing time for annealing the region of the semiconductor film layer having the carrier concentration larger than the concentration threshold and thereby decrease the carrier concentration of the region, such that the carrier concentration of the region becomes the same as or equal to the concentration threshold, that is, such that the carrier concentration of the region becomes completely or substantially the same as or equal to the concentration threshold. The first adjustment device 43 adjusts the heaters 20 according to the comparison result from the first determination device 42 so as to thereby adjust carrier concentrations of respective regions of the semiconductor film layer, such the carrier concentrations of the respective regions of the semiconductor film layer are the same as or identical to the concentration threshold, thereby achieving identical carrier concentrations of the respective regions of the semiconductor film layer and thus improving the display quality of an image displayed by the display device.

In the above embodiments, when the controller adjusts, according to the carrier concentrations of the respective regions of the film layer detected by the carrier detector, at least one of a heating temperature and a heating time of each heater for heating a corresponding one of the regions of the film layer, the detected carrier concentrations of the respective regions of the semiconductor film layer is compared to a preset concentration threshold, and then the carrier concentrations of the respective regions of the semiconductor film layer are adjusted, such that the carrier concentrations of the respective regions of the semiconductor film layer are the same or identical; in practice, the adjustment may be made without using any preset concentration threshold.

Figure 7:
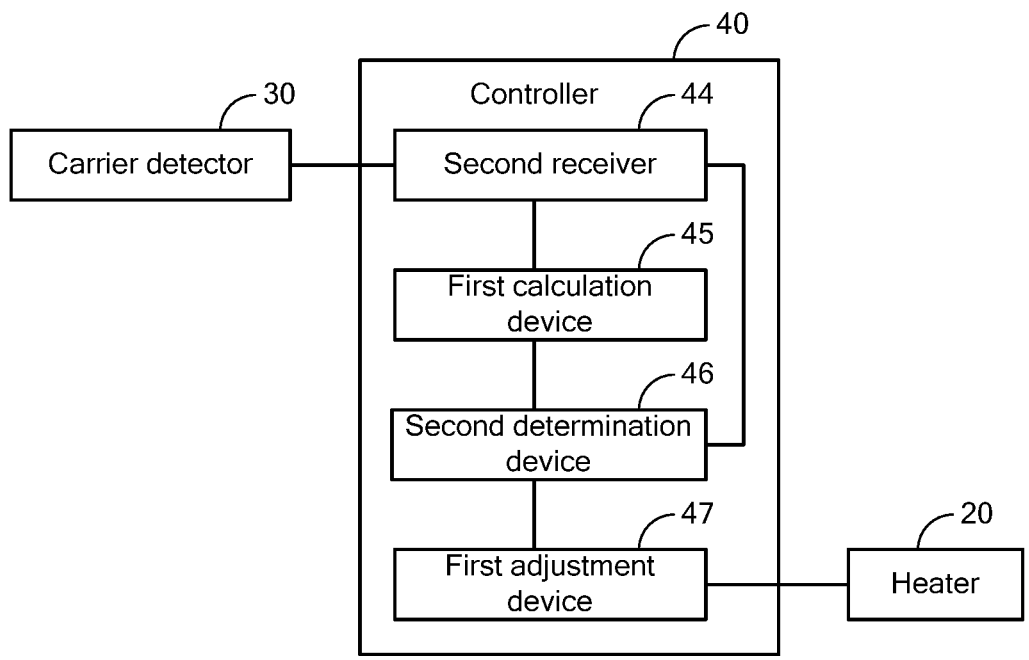
FIG. 7 is a block diagram showing an arrangement of a carrier detector, a controller and a heater of a film annealing apparatus according to another embodiment of the present disclosure.

In another embodiment, referring to FIG. 7, the controller 40 may comprises a second receiver 44, a first calculation device 45, a second determination device 46 and a second adjustment device 47; the second receiver 44 is electrically connected with or in electrical communication with the carrier detector 30 and configured to receive the carrier concentrations of the respective regions of the semiconductor film layer detected by the carrier detector 30; the first calculation device 45 is electrically connected with the second receiver 44 and configured to calculate an average value of the carrier concentrations of the respective regions of the semiconductor film layer detected before the adjustment or after being previously adjusted; the second determination device 46 is electrically connected with the second receiver 44 and the first calculation device 45 respectively and configured to compare the carrier concentration of a being-currently-adjusted one of the regions of the semiconductor film layer with the average value; the second adjustment device 47 is electrically connected with the second determination device 47 and each heater 20 respectively, and configured to, if the carrier concentration of the being-currently-adjusted one of the regions of the semiconductor film layer is smaller than the average value, increase at least one of the heating temperature and the heating time of the heater 20 (for example, the heater corresponding to the being-currently-adjusted region of the semiconductor film layer) for subsequently heating the being-currently-adjusted one of the regions of the semiconductor film layer such that the carrier concentration of the adjusted one of the regions of the annealed semiconductor film layer becomes the same as or equal to the average value; the second adjustment device 47 is further configured to, if the carrier concentration of the being-currently-adjusted one of the regions of the semiconductor film layer is larger than the average value, reduce at least one of the heating temperature and the heating time of the heater 20 (for example, the heater corresponding to the being-currently-adjusted region of the semiconductor film layer) for subsequently heating the being-currently-adjusted one of the regions of the semiconductor film layer such that the carrier concentration of the adjusted one of the regions of the annealed semiconductor film layer is the same as or equal to the average value.

When implemented in practice, the second receiver 44 receives the carrier concentrations of the respective regions of the semiconductor film layer detected by the carrier detector 30; when making adjustment to a first region of semiconductor film layer, the first calculation device 45 may use the carrier concentration of the first region of the semiconductor film layer detected by the carrier detector 30 as an average value, and at this time, the second determination device may make no comparison operation, and the second adjustment device 47 makes no adjustment to the heating temperature and/or the heating time of the heater 20, which corresponds to the first region of the semiconductor film layer, for heating the first region. Then, when making adjustment to a second region of the semiconductor film layer, the first calculation device 45 may use the carrier concentration of the first region of the semiconductor film layer detected by the carrier detector 30 as an average value, the second determination device 46 compares the carrier concentration of the second region of the semiconductor film layer detected by the carrier detector 30 to the average value; when the second determination device 46 determines the carrier concentration of the second region of the semiconductor film layer detected by the carrier detector 30 is smaller than the average value, the second adjustment device 47 increases the heating temperature and/or the heating time of the heater 20, which corresponds to the second region of the semiconductor film layer, for subsequently heating the second region so as to increase an annealing temperature and/or an annealing time for annealing the second region of the semiconductor film layer and thereby increase the carrier concentration of the second region of the semiconductor film layer, such that the carrier concentration of the second region of the semiconductor film layer becomes the same as the average value, that is, such that the carrier concentration of the second region of the semiconductor film layer becomes completely or substantially the same as the average value; when the second determination device 46 determines the carrier concentration of the second region of the semiconductor film layer detected by the carrier detector 30 is larger than the average value, the second adjustment device 47 reduces the heating temperature and/or the heating time of the heater 20, which corresponds to the second region of the semiconductor film layer, for subsequently heating the second region; for example, the second adjustment device 47 causes the heater 20, which corresponds to the second region of the semiconductor film layer, to stop heating the second region; in some examples, when the heater 20 is a heater for heating by using a current, the second adjustment device 47 controls the amplitude and/or turning-on time of the current inputted to the heater 20, which corresponds to the second region of the semiconductor film layer, to be reduced so as to decrease an annealing temperature and/or an annealing time for annealing the second region of the semiconductor film layer and thereby decrease the carrier concentration of the second region of the semiconductor film layer, such that the carrier concentration of the second region of the semiconductor film layer becomes the same as or equal to the concentration threshold, that is, such that the carrier concentration of the region becomes completely or substantially the same as or equal to the average value, that is, such that the carrier concentration of the second region of the semiconductor film layer becomes completely or substantially the same as the average value.

Then, when making adjustment to a third region of the semiconductor film layer, the first calculation device 45 calculates an average value of the carrier concentration of the first region of the semiconductor film layer and the carrier concentration of the second region of the semiconductor film layer, the second determination device 46 compares the carrier concentration of the third region of the semiconductor film layer detected by the carrier detector 30 to the average value calculated by the first calculation device 45; when the second determination device 46 determines the carrier concentration of the third region of the semiconductor film layer detected by the carrier detector 30 is smaller than the average value calculated by the first calculation device 45, the second adjustment device 47 increases the heating temperature and/or the heating time of the heater 20, which corresponds to the third region of the semiconductor film layer, for subsequently heating the third region so as to increase an annealing temperature and/or an annealing time for subsequently annealing the third region of the semiconductor film layer and thereby increase the carrier concentration of the third region of the semiconductor film layer, such that the carrier concentration of the third region of the semiconductor film layer becomes the same as the average value calculated by the first calculation device 45, that is, such that the carrier concentration of the third region of the semiconductor film layer becomes completely or substantially the same as the average value calculated by the first calculation device 45; when the second determination device 46 determines the carrier concentration of the third region of the semiconductor film layer detected by the carrier detector 30 is larger than the average value calculated by the first calculation device 45, the second adjustment device 47 reduces the heating temperature and/or the heating time of the heater 20, which corresponds to the third region of the semiconductor film layer, for subsequently heating the third region so as to decrease an annealing temperature and/or an annealing time for subsequently annealing the third region of the semiconductor film layer and thereby decrease the carrier concentration of the third region of the semiconductor film layer, such that the carrier concentration of the third region of the semiconductor film layer becomes the same as the average value calculated by the first calculation device 45, that is, such that the carrier concentration of the third region of the semiconductor film layer becomes completely or substantially the same as the average value calculated by the first calculation device 45. Similarly, the respective regions of the semiconductor film layer are adjusted in turn, such that the carrier concentrations of the respective regions of the semiconductor film layer are at a same level, thereby improving the display quality of an image displayed by the display device.

In embodiments of the present disclosure, there may be various arrangements for the heaters 20. For example, in one embodiment, referring to FIG. 1 again, a plurality of heaters 20 may be disposed below the carrying platform 10, the plurality of heaters 20 may be arranged such that surfaces or heating surfaces of them facing towards the substrate 50 are in a same plane or aligned with each other, or positioned at a substantially same distance from the substrate or the semiconductor film layer on the substrate. In an example, the plurality of heaters 20 may be bonded onto the carrying platform 10; when the heaters 20 operate, heat are transferred through the carrying platform 10 to the semiconductor film layer 51 on the substrate 50 in a heat conduction way so as to anneal the semiconductor film layer; or, the plurality of heaters 20 may be disposed within the carrying platform 10 such that surfaces or heating surfaces of them facing towards the substrate 50 may be flush with a carrying surface of the carrying platform 10 carrying thereon the substrate 50.

Figure 8:
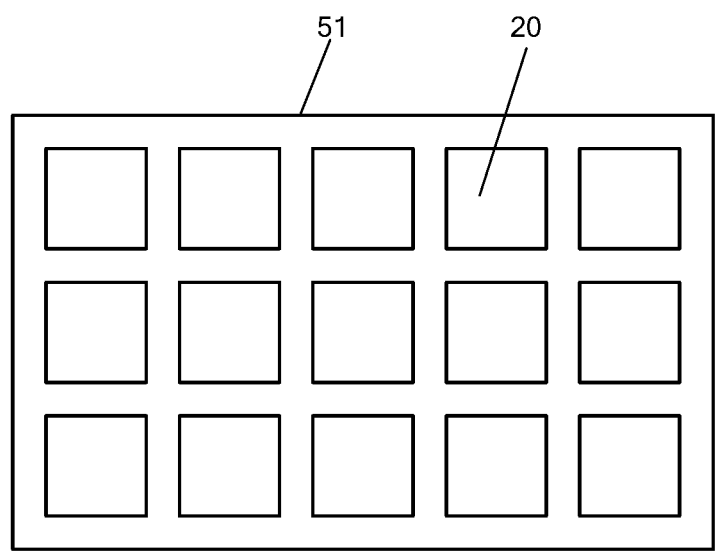
FIG. 8 is a plan view showing an arrangement of a plurality of heaters, relative to a film layer, of a film annealing apparatus according to an embodiment of the present disclosure.
Figure 9:
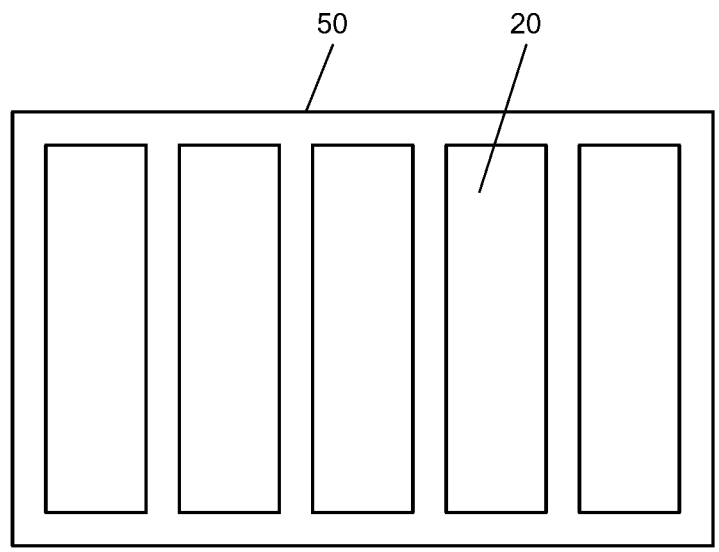
FIG. 9 is a plan view showing an arrangement of a plurality of heaters, relative to a film layer, of a film annealing apparatus according to another embodiment of the present disclosure.
Figure 10A:
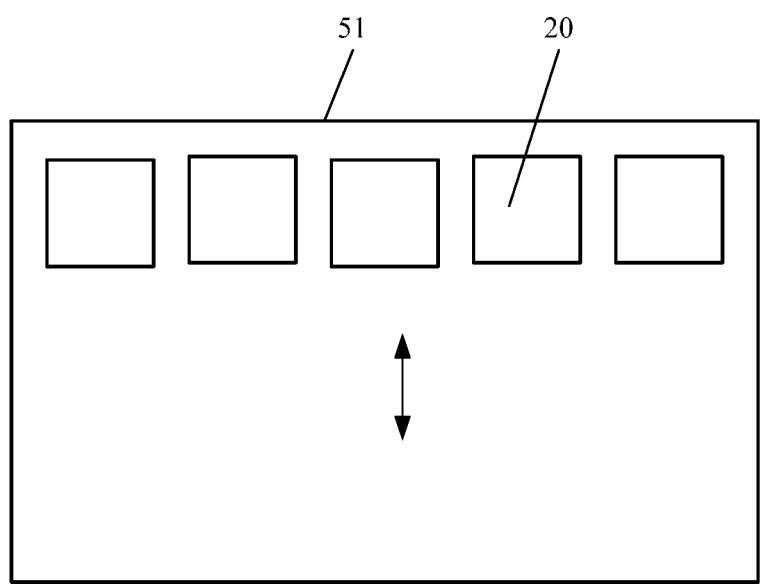
FIG. 10A is a plan view showing an arrangement of a plurality of heaters, relative to a film layer, of a film annealing apparatus according to a further embodiment of the present disclosure.
Figure 10B:
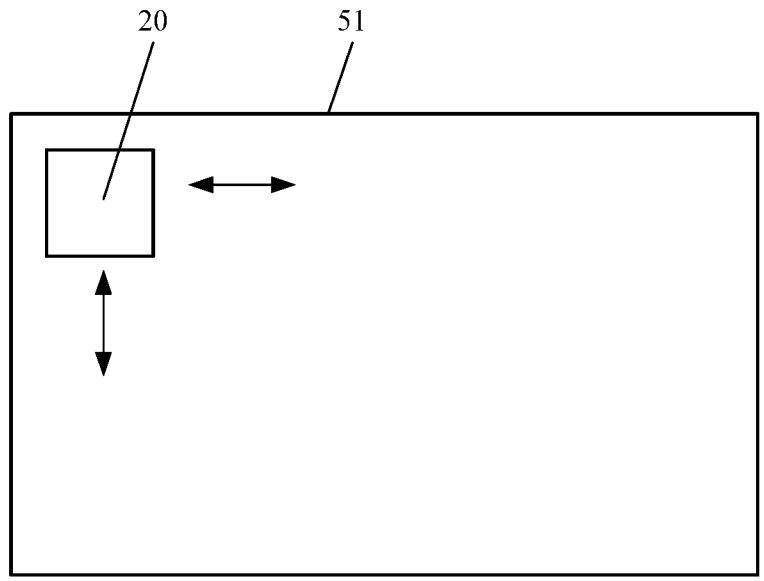
FIG. 10B is a plan view showing an arrangement of a plurality of heaters, relative to a film layer, of a film annealing apparatus according to a still further embodiment of the present disclosure.

The plurality of heaters are used to heat respective regions of the semiconductor film layer, and each heater has a heating range covering some (for example, one or more) of the regions of semiconductor film layer. In practice, the arrangement of the plurality of heaters may be determined according to a spliced configuration of a spliced sputtering target used in the magnetron sputtering process of forming the semiconductor film layer; for example, when semiconductor material targets of the spliced sputtering target have a rectangular block shape and a plurality of the semiconductor material targets are arranged in an array so as to be spliced together, referring to FIG. 8, the heater 20 may also have a rectangular block shape, and a plurality of the heaters 20 may be arranged in an array such that each heater 20 has a heating range at least covering a rectangular block shaped region of the semiconductor film layer; or, when semiconductor material targets of the spliced sputtering target have a strip shape and a plurality of the semiconductor material targets are arranged in parallel so as to be spliced together, referring to FIG. 9, the heater 20 may also have a strip shape, and a plurality of the heaters 20 may be arranged in parallel such that each heater 20 has a heating range at least covering a strip-shaped region of the semiconductor film layer. In the embodiments shown in FIG. 8 and FIG. 9, the heaters are fixed in position relative to the semiconductor film layer, and have an arrangement matching or corresponding to respective regions of semiconductor film layer. In other embodiment, the heater is movable relative to the semiconductor film layer so as to heat or anneal different regions of the semiconductor film layer as required. As shown in FIG. 10A, the film annealing apparatus comprises a plurality of heaters 20, the plurality of heaters 20 are arranged in one row in an arrangement direction, such that each heater is movable relative to the semiconductor film layer in a direction perpendicular to the arrangement direction, so as to heat or anneal different regions of the semiconductor film layer based on requirements for adjusting the carrier concentration; as shown in FIG. 10B, the film annealing apparatus is only provided with a single heater 20, which is movable relative to the semiconductor film layer at least in two directions perpendicular to each other, so as to heat or anneal different regions of the semiconductor film layer based on requirements for adjusting the carrier concentration.

In embodiments of the present disclosure, the heater 20 may be a heating block or has a block or plate shape; or, the heater 20 may also be a heating wire.

In embodiments of the present disclosure, the semiconductor film layer may be any type of semiconductor film layer required to be annealed, for example, the semiconductor film layer may be a metal oxide film layer, such as an Indium Gallium Zinc Oxide (IGZO) layer, a Zinc Oxide (ZnO) layer or the like; or, the semiconductor film layer may be an amorphous silicon layer; or, the semiconductor film layer may be a polysilicon layer; or, the semiconductor film layer may be a monocrystalline silicon layer.

Figure 11:
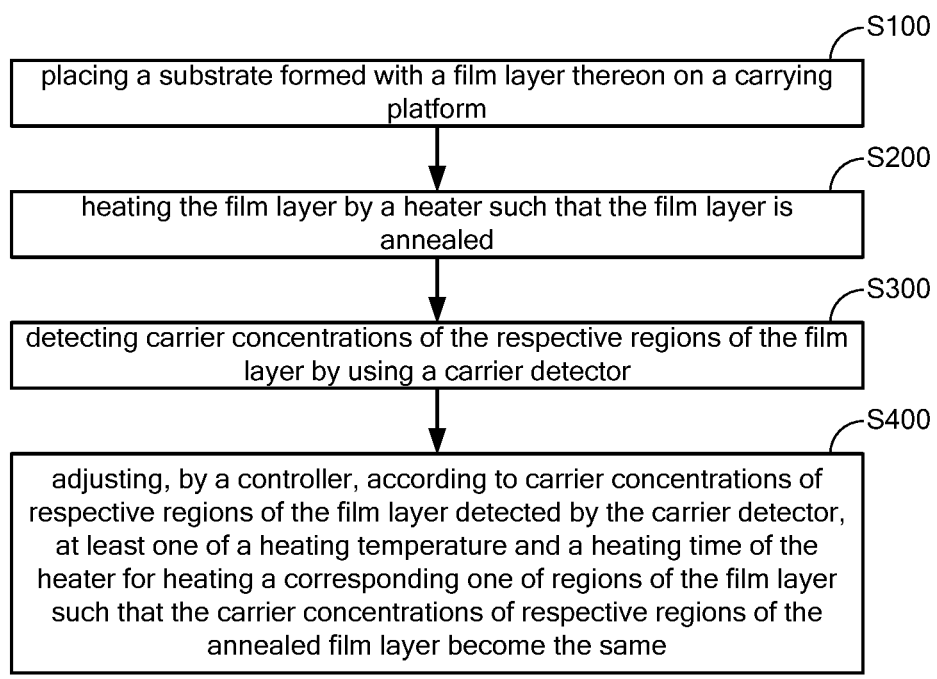
FIG. 11 is a flow chart showing a method of annealing a film layer according to an embodiment of the present disclosure.

Embodiments of the present disclosure also provides an method of annealing a film layer, which may anneal the film layer by using the film annealing apparatus described in above embodiments. Referring to FIG. 11, the method comprises:

step S100: placing a substrate formed with a film layer thereon on a carrying platform;

step S200: heating the film layer by a heater such that the film layer is annealed;

step S300: detecting carrier concentrations of the respective regions of the film layer by using a carrier detector; and step S400: adjusting, by a controller, according to the carrier concentrations of the respective regions of the film layer detected by the carrier detector, at least one of a heating temperature and a heating time of the heater for heating a corresponding one of the regions of the film layer such that the carrier concentrations of the respective regions of the annealed film layer become the same.

Same or similar parts in various embodiments of the present specification may be referred to each other, and each embodiment is only described intensively in terms of its difference(s) from other embodiment(s).

In the above embodiment, the step S400, adjusting, by a controller, according to the carrier concentrations of the respective regions of the film layer detected by the carrier detector, at least one of a heating temperature and a heating time of the heater for heating a corresponding one of the regions of the film layer such that the carrier concentrations of the respective regions of the annealed film layer become the same, may be implemented in various ways.

Figure 12:
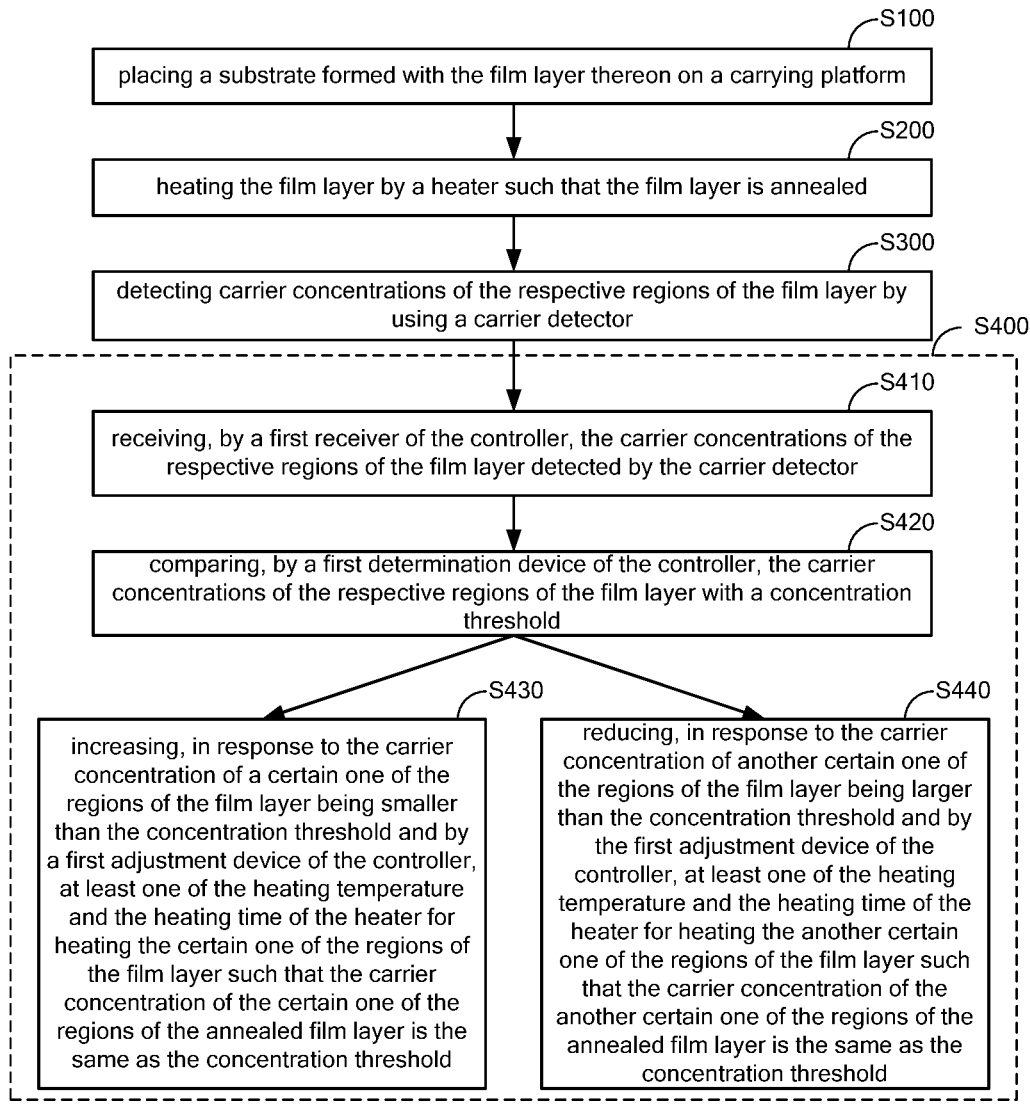
FIG. 12 is a flow chart showing a method of annealing a film layer according to another embodiment of the present disclosure.

In one embodiment, referring to FIG. 12, the step S400, adjusting, by a controller, according to the carrier concentrations of the respective regions of the film layer detected by the carrier detector, at least one of a heating temperature and a heating time of the heater for heating a corresponding one of the regions of the film layer such that the carrier concentrations of the respective regions of the annealed film layer become the same, may comprise:

step S410: receiving, for example, by a first receiver of the controller, the carrier concentrations of the respective regions of the film layer detected by the carrier detector;

step S420: comparing, for example, by a first determination device of the controller, the carrier concentrations of the respective regions of the film layer with a concentration threshold;

step S430: increasing, in response to the carrier concentration of a certain one of the regions of the film layer being smaller than the concentration threshold and by, for example, a first adjustment device of the controller, at least one of the heating temperature and the heating time of the heater for heating the certain one of the regions of the film layer such that the carrier concentration of the certain one of the regions of the annealed film layer becomes the same as the concentration threshold; and step S440: reducing, in response to the carrier concentration of another certain one of the regions of the film layer being larger than the concentration threshold and by the first adjustment device of the controller, at least one of the heating temperature and the heating time of the heater for heating the another certain one of the regions of the film layer such that the carrier concentration of the another certain one of the regions of the annealed film layer becomes the same as the concentration threshold.

Figure 13:
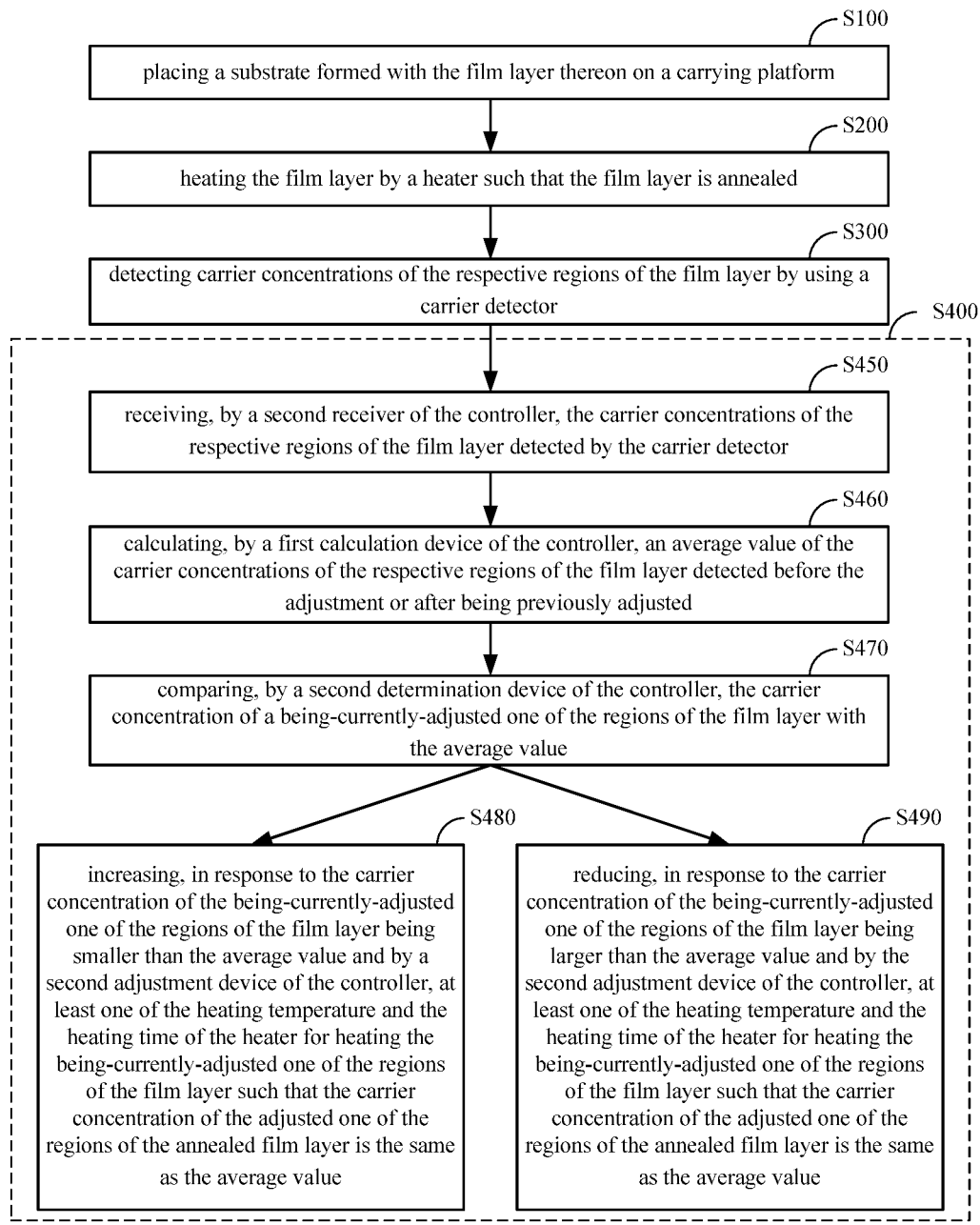
FIG. 13 is a flow chart showing a method of annealing a film layer according to a further embodiment of the present disclosure.

In another embodiment, referring to FIG. 13, the step S400, adjusting, by a controller, according to the carrier concentrations of the respective regions of the film layer detected by the carrier detector, at least one of a heating temperature and a heating time of the heater for heating a corresponding one of the regions of the film layer such that the carrier concentrations of the respective regions of the annealed film layer become the same, may comprise:

step S450: receiving, for example, by a second receiver of the controller, the carrier concentrations of the respective regions of the film layer detected by the carrier detector;

step S460: calculating, for example, by a first calculation device of the controller, an average value of the carrier concentrations of the respective regions of the film layer detected before the adjustment or after being previously adjusted;

step S470: comparing, for example, by a second determination device of the controller, the carrier concentration of a being-currently-adjusted one of the regions of the film layer with the average value;

step S480: increasing, in response to the carrier concentration of the being-currently-adjusted one of the regions of the film layer being smaller than the average value and by a second adjustment device of the controller, at least one of the heating temperature and the heating time of the heater for heating the being-currently-adjusted one of the regions of the film layer such that the carrier concentration of the adjusted one of the regions of the annealed film layer becomes the same as the average value; and step S490: reducing, in response to the carrier concentration of the being-currently-adjusted one of the regions of the film layer being larger than the average value and by the second adjustment device of the controller, at least one of the heating temperature and the heating time of the heater for heating the being-currently-adjusted one of the regions of the film layer such that the carrier concentration of the adjusted one of the regions of the annealed film layer becomes the same as the average value.

In the present disclosure, the step S300, detecting carrier concentrations of the respective regions of the film layer by using a carrier detector, may also be implemented in various ways.

Figure 14:
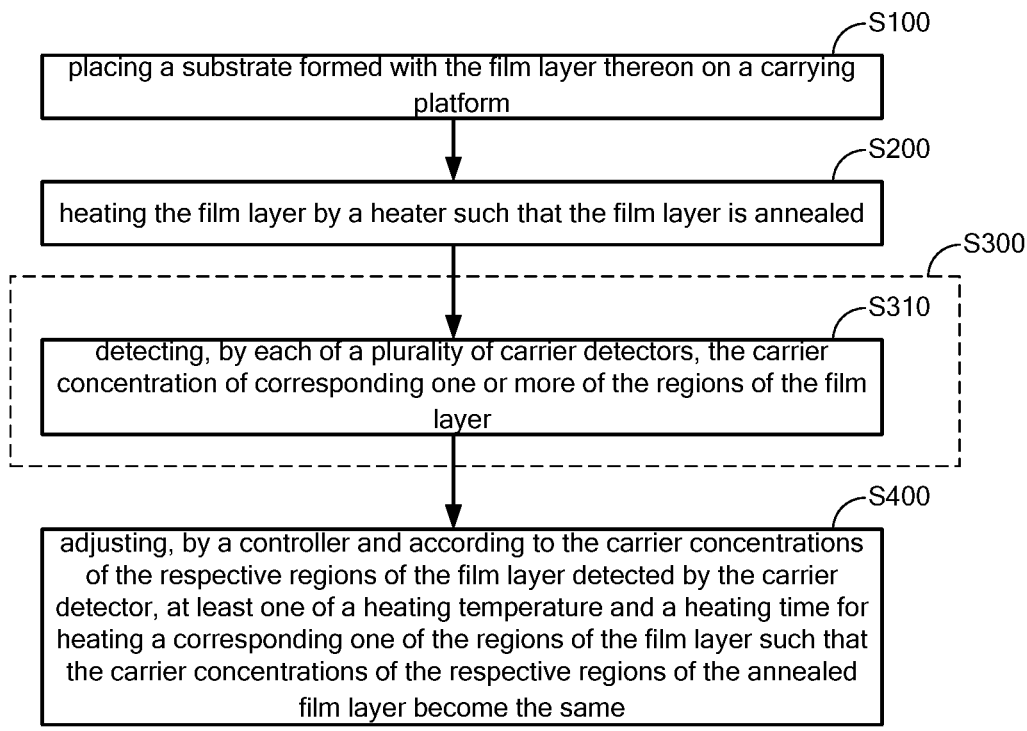
FIG. 14 is a flow chart showing a method of annealing a film layer according to a yet another embodiment of the present disclosure.

In one embodiment, referring to FIG. 14, the step S300, detecting carrier concentrations of the respective regions of the film layer by using a carrier detector, may also be implemented in various ways, may comprise:

step S310: detecting, by each of a plurality of the carrier detectors, the carrier concentration of corresponding one or more of the regions of the film layer.

Figure 15:
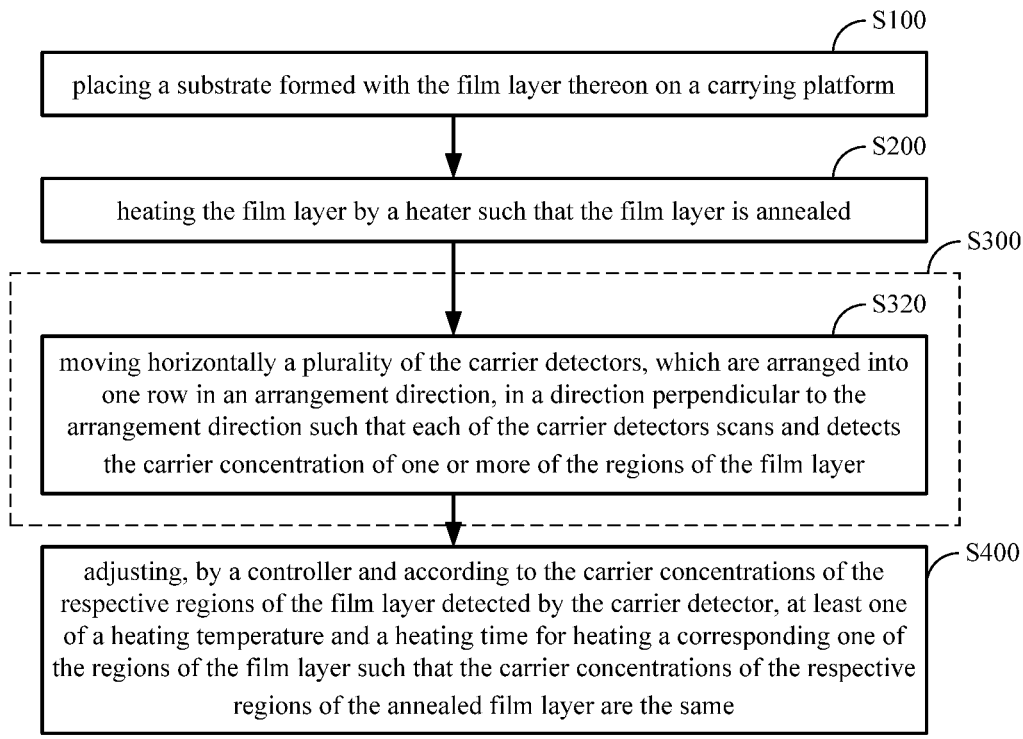
FIG. 15 is a flow chart showing a method of annealing a film layer according to a still yet another embodiment of the present disclosure.

In another embodiment, referring to FIG. 15, the step S300, detecting carrier concentrations of the respective regions of the film layer by using a carrier detector, may also be implemented in various ways, may comprise:

step S320: moving horizontally a plurality of the carrier detectors, which are arranged into one row in an arrangement direction, in a direction perpendicular to the arrangement direction such that each of the carrier detectors scans and detects the carrier concentration of one or more of the regions of the film layer.

Figure 16:
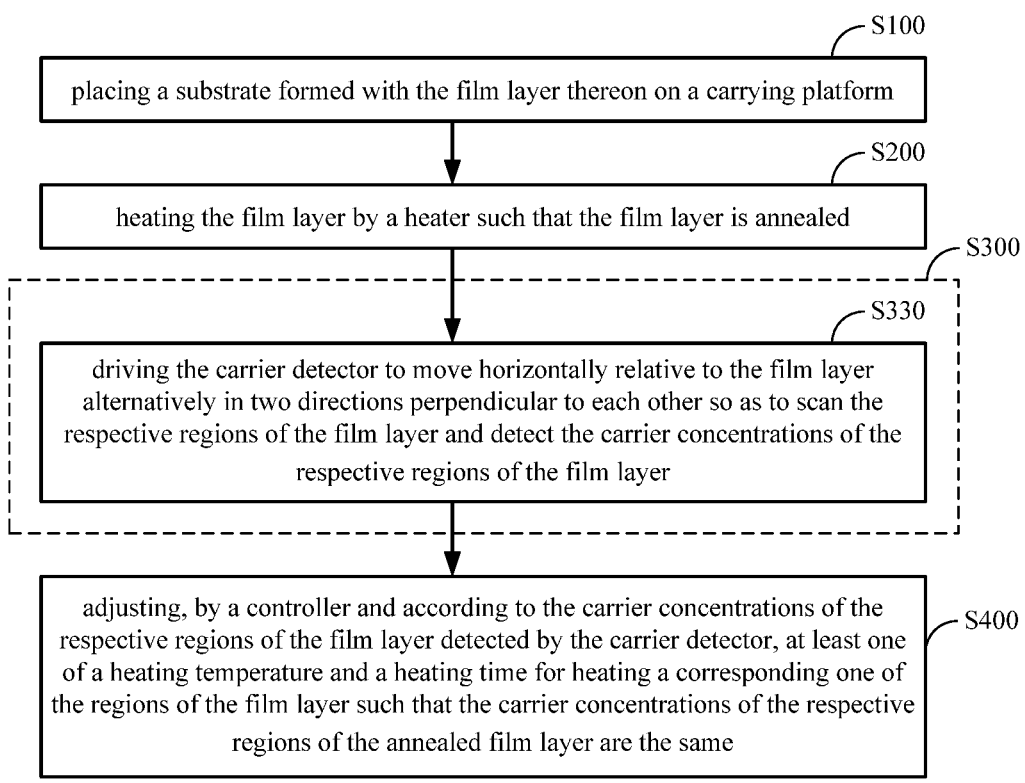
FIG. 16 is a flow chart showing a method of annealing a film layer according to a still further embodiment of the present disclosure.

In a further embodiment, referring to FIG. 16, the step S300, detecting carrier concentrations of the respective regions of the film layer by using a carrier detector, may also be implemented in various ways, may comprise:

step S330: driving the carrier detector to move horizontally relative to the film layer alternatively in two directions perpendicular to each other so as to scan the respective regions of the film layer and detect the carrier concentrations of the respective regions of the film layer.

In the film annealing apparatus and method provided in the embodiments of the present disclosure, carrier concentrations of respective regions of the semiconductor film layer on the substrate placed on the carrying platform is detected by the carrier detector, and the controller is used to adjust, according to the carrier concentrations of the respective regions of the film layer detected by the carrier detector, at least one of a heating temperature and a heating time of the heater for heating a corresponding one of the regions of the film layer so as to adjust annealing temperatures and/or annealing times for the respective regions of the film layer, and thereby adjust the carrier concentrations of the respective regions of the film layer such that the carrier concentrations of the respective regions of the annealed film layer are the same or identical. Thus, after subsequently processing the semiconductor film layer to form an active layer, the carrier concentrations of the active layers of a plurality of thin film transistors formed on the substrate have a uniform distribution, thereby improving the display quality of an image displayed by the display device, for example, preventing occurrence of a mura phenomenon.

In the description of the above description, specific features, structures, materials or characteristics may be combined in an appropriate way in any one or more embodiments or examples.

The above described contents are merely exemplary embodiments of the disclosure, and the scope of the present disclosure is not limited thereto. Changes or alternations which are easily made by those skilled in the art should fall within the scope of the disclosure. Therefore, the scope of the disclosure should be solely defined by the scope of claims and equivalents thereof.

What is claimed is:

1. A film annealing apparatus, comprising:
    a carrying platform configured to carry a substrate formed with a film layer thereon;
    a heater configured to individually heat respective regions of the film layer such that the film layer is annealed;
    a carrier detector configured to detect carrier concentrations of the respective regions of the film layer; and
    a controller electrically connected with the carrier detector and the heater, respectively, and configured to, according to the carrier concentrations of the respective regions of the film layer detected by the carrier detector, adjust at least one of a heating temperature and a heating time of the heater for heating a corresponding one of the regions of the film layer such that the carrier concentrations of the respective regions of the annealed film layer become the same.

2. The film annealing apparatus according to claim 1, wherein the carrier detector comprises a plurality of the carrier detector units located above the carrying platform and each configured to detect the carrier concentration of corresponding one or more of the regions of the film layer.

3. The film annealing apparatus according to claim 1, wherein the carrier detector comprises a plurality of the carrier detector units arranged into one row in an arrangement direction, the one row of the carrier detector units being located above the carrying platform and movable horizontally in a direction perpendicular to the arrangement direction so as to scan the respective regions of the film layer, such that each of the carrier detector units detects the carrier concentration of one or more of the regions of the film layer scanned by that carrier detector unit.

4. The film annealing apparatus according to claim 1, wherein the carrier detector comprises a single carrier detector unit,
    the carrier detector unit is located above the carrying platform, and
    the carrier detector unit is movable horizontally at least in two directions perpendicular to each other so as to scan the respective regions of the film layer and detect the carrier concentrations of the respective regions of the film layer.

5. The film annealing apparatus according to claim 1, wherein the carrier detector is configured to detect the carrier concentrations of the respective regions of the film layer in a Microwave Photo Conductivity Decay manner.

6. The film annealing apparatus according to claim 1, wherein the controller comprises a first receiver, a first determination device and a first adjustment device, and wherein
    the first receiver is in electrical communication with the carrier detector and is configured to receive the carrier concentrations of the respective regions of the film layer detected by the carrier detector;
    the first determination device is electrically connected with the first receiver and is configured to compare the carrier concentrations of the respective regions of the film layer with a concentration threshold; and
    the first adjustment device is electrically connected with the first determination device and the heater, respectively, and is configured to, according to the comparison result, adjust at least one of the heating temperature and the heating time of the heater for heating a corresponding one of the regions of the film layer such that the carrier concentrations of the respective regions of the annealed film layer become the same as the concentration threshold.

7. The film annealing apparatus according to claim 6, wherein the first adjustment device is configured to:
in response to the carrier concentration of a first one of the regions of the film layer being smaller than the concentration threshold, increase at least one of the heating temperature and the heating time of the heater for heating the first one of the regions of the film layer such that the carrier concentration of the first one of the regions of the annealed film layer becomes the same as the concentration threshold; and
in response to the carrier concentration of a second one of the regions of the film layer being larger than the concentration threshold, reduce the heating temperature and/or the heating time of the heater for heating the second one of the regions of the film layer such that the carrier concentration of the second one of the regions of the annealed film layer becomes the same as the concentration threshold.

8. The film annealing apparatus according to claim 1, wherein the controller comprises a second receiver, a first calculation device, a second determination device and a second adjustment device, and wherein,
the second receiver is in electrical communication with the carrier detector and is configured to receive the carrier concentrations of the respective regions of the film layer detected by the carrier detector;
the first calculation device is electrically connected with the second receiver and is configured to calculate an average value of the carrier concentrations of the respective regions of the film layer detected before the adjustment or after being previously adjusted;
the second determination device is electrically connected with the second receiver and the first calculation device, respectively, and is configured to compare the carrier concentration of a being-currently-adjusted one of the regions of the film layer with the average value; and
the second adjustment device is electrically connected with the second determination device and the heater, respectively, and is configured to, according to the comparison result, adjust at least one of the heating temperature and the heating time of the heater for heating the being-currently-adjusted of the regions of the film layer such that the carrier concentrations of the respective regions of the annealed film layer become the same as the average value.

9. The film annealing apparatus according to claim 8, wherein the second adjustment device is configured to:
in response to the carrier concentration of the being-currently-adjusted one of the regions of the film layer being smaller than the average value, increase at least one of the heating temperature and the heating time of the heater for heating the being-currently-adjusted one of the regions of the film layer such that the carrier concentration of the adjusted one of the regions of the annealed film layer becomes the same as the average value; and
in response to the carrier concentration of the being-currently-adjusted one of the regions of the film layer being larger than the average value, reduce at least one of the heating temperature and the heating time of the heater for heating the being-currently-adjusted one of the regions of the film layer such that the carrier concentration of the adjusted one of the regions of the annealed film layer becomes the same as the average value.

10. The film annealing apparatus according to claim 1, wherein the heater comprises a plurality of heater units, the plurality of heater units being arranged in an array and corresponding to the respective regions of the film layer such that each of the plurality of heater units is controlled by the controller to heat one or more of the regions of the film layer.

11. The film annealing apparatus according to claim 1, wherein the heater comprises a plurality of heater units arranged into one row in an arrangement direction, each of the plurality of heater units being movable relative to the film layer in a direction perpendicular to the arrangement direction so as to heat one or more of the regions of the film layer.

12. The film annealing apparatus according to claim 1, wherein the heater comprises a single heater unit that is movable relative to the film layer at least in two directions perpendicular to each other so as to heat one or more of the regions of the film layer.

13. The film annealing apparatus according to claim 1, wherein the heater is located below the carrying platform, or the heater is located within the carrying platform.

14. The film annealing apparatus according to claim 1, wherein the heater includes a heating block or a heating wire.

15. A method of annealing a film layer, comprising:
placing a substrate formed with the film layer thereon on a carrying platform;
heating the film layer by a heater such that the film layer is annealed;
detecting carrier concentrations of the respective regions of the film layer by using a carrier detector; and
adjusting, by a controller, according to the carrier concentrations of the respective regions of the film layer detected by the carrier detector, at least one of a heating temperature and a heating time for heating a corresponding one of the regions of the film layer such that the carrier concentrations of the respective regions of the annealed film layer become the same.

16. The method according to claim 15, wherein, adjusting, by the controller and according to the carrier concentrations of the respective regions of the film layer detected by the carrier detector, at least one of the heating temperature and the heating time for heating the corresponding one of the regions of the film layer such that the carrier concentrations of the respective regions of the annealed film layer become the same comprises:
receiving, by a first receiver of the controller, the carrier concentrations of the respective regions of the film layer detected by the carrier detector;
comparing, by a first determination device of the controller, the carrier concentrations of the respective regions of the film layer with a concentration threshold;
increasing, in response to the carrier concentration of a certain one of the regions of the film layer being smaller than the concentration threshold and by a first adjustment device of the controller, at least one of the heating temperature and the heating time of the heater for heating the certain one of the regions of the film layer such that the carrier concentration of the certain one of the regions of the annealed film layer becomes the same as the concentration threshold; and
reducing, in response to the carrier concentration of another certain one of the regions of the film layer being larger than the concentration threshold and by the first adjustment device of the controller, at least one of the heating temperature and the heating time of the heater for heating the another certain one of the regions of the film layer such that the carrier concentration of the another certain one of the regions of the annealed film layer becomes the same as the concentration threshold.

17. The method according to claim 15, wherein, adjusting, by the controller, according to the carrier concentrations of the respective regions of the film layer detected by the carrier detector, at least one of the heating temperature and the heating time for heating the corresponding one of the regions of the film layer such that the carrier concentrations of the respective regions of the annealed film layer become the same comprises:
  receiving, by a second receiver of the controller, the carrier concentrations of the respective regions of the film layer detected by the carrier detector;
  calculating, by a first calculation device of the controller, an average value of the carrier concentrations of the respective regions of the film layer detected before the adjustment or after being previously adjusted;
  comparing, by a second determination device of the controller, the carrier concentration of a being-currently-adjusted one of the regions of the film layer with the average value;
  increasing, in response to the carrier concentration of the being-currently-adjusted one of the regions of the film layer being smaller than the average value and by a second adjustment device of the controller, at least one of the heating temperature and the heating time of the heater for heating the being-currently-adjusted one of the regions of the film layer such that the carrier concentration of the adjusted one of the regions of the annealed film layer becomes the same as the average value; and
  reducing, in response to the carrier concentration of the being-currently-adjusted one of the regions of the film layer being larger than the average value and by the second adjustment device of the controller, at least one of the heating temperature and the heating time of the heater for heating the being-currently-adjusted one of the regions of the film layer such that the carrier concentration of the adjusted one of the regions of the annealed film layer becomes the same as the average value.

18. The method according to claim 15, wherein, detecting carrier concentrations of the respective regions of the film layer by using the carrier detector comprises:
  detecting, by each of a plurality of the carrier detectors, the carrier concentration of one or more of the corresponding regions of the film layer.

19. The method according to claim 15, wherein, detecting carrier concentrations of the respective regions of the film layer by using the carrier detector comprises:
  moving horizontally a plurality of the carrier detectors, which are arranged into one row in an arrangement direction, in a direction perpendicular to the arrangement direction such that each of the carrier detectors scans and detects the carrier concentration of one or more of the regions of the film layer.

20. The method according to claim 15, wherein, detecting carrier concentrations of the respective regions of the film layer by using the carrier detector comprises:
  driving the carrier detector to move horizontally relative to the film layer alternately in two directions perpendicular to each other so as to scan the respective regions of the film layer and detect the carrier concentrations of the respective regions of the film layer.

* * * * *